United States Patent [19]

Shirley et al.

[11] Patent Number: 5,739,576
[45] Date of Patent: Apr. 14, 1998

[54] INTEGRATED CHIP MULTILAYER DECOUPLING CAPACITORS

[75] Inventors: Brian M. Shirley; Stephen L. Casper; Tyler A. Lowrey; Kevin G. Duesman, all of Boise, Id.

[73] Assignee: Micron Technology, Inc., Boise, Id.

[21] Appl. No.: 539,855

[22] Filed: Oct. 6, 1995

[51] Int. Cl.$^6$ .................................................. H01L 29/00
[52] U.S. Cl. ........................................ 257/532; 257/306
[58] Field of Search ............................. 257/68, 306, 307, 257/300, 296, 532, 754, 756, 534, 916, 924

[56] References Cited

U.S. PATENT DOCUMENTS

| | | | |
|---|---|---|---|
| 4,914,546 | 4/1990 | Alter | 361/313 |
| 5,005,072 | 4/1991 | Gonzalez | 257/534 |
| 5,032,892 | 7/1991 | Chern et al. | 357/51 |
| 5,066,999 | 11/1991 | Casper | 357/51 |
| 5,103,275 | 4/1992 | Miura et al. | 257/532 |
| 5,124,765 | 6/1992 | Kim et al. | 257/534 |
| 5,149,668 | 9/1992 | Rhodes et al. | 437/52 |
| 5,151,760 | 9/1992 | Gill et al. | 257/534 |
| 5,194,753 | 3/1993 | Rhodes et al. | 257/775 |
| 5,266,821 | 11/1993 | Chern et al. | 257/312 |
| 5,304,506 | 4/1994 | Porter | 437/60 |

*Primary Examiner*—Carl W. Whitehead
*Assistant Examiner*—S. V. Clark
*Attorney, Agent, or Firm*—Schwegman, Lundberg, Woessner & Kluth, P.A.

[57] ABSTRACT

A multilayer decoupling capacitor structure is disclosed, having a first decoupling capacitor with one electrode formed in a conductively doped silicon substrate and a second electrode made of conductively doped polysilicon. A third bifurcated conductive layer disposed above the second electrode in conjunction with a fourth conductive layer above the third layer form a second and third decoupling capacitor. The first decoupling capacitor serves to decouple circuitry associated with dynamic random access memory cells, while the second and third decoupling capacitors provide decoupling for further circuitry.

1 Claim, 2 Drawing Sheets

INTEGRATED CHIP MULTILAYER DECOUPLING CAPACITORS

FIELD OF THE INVENTION

The present invention relates to integrated circuits, and in particular to improving the capacitive decoupling of integrated circuits.

BACKGROUND OF THE INVENTION

Decoupling capacitors in semiconductor circuitry are essential components used to filter much of the noise that may be present between operating supplies such as power and ground. Some fabrication processes construct thin film decoupling capacitors on a silicon substrate by forming one electrode into the substrate itself, and then forming a second electrode out of an overlying conductive material with the two electrodes being separated by a dielectric material. In U.S. Pat. No. 5,304,506 to Porter et al., a further electrode is formed, overlying the second electrode and is electrically isolated therefrom by a dielectric material. The second and third electrodes form a second decoupling capacitor which can be coupled in series or in parallel depending on the choice of the circuit designer. A series connection will protect against one of the decoupling capacitors becoming shorted out by errant subsequent implants. If one capacitor shorts, the other will adequately decouple the noise. If coupled in parallel, the overall decoupling capacitance is increased.

The use of depletion mode decoupling capacitors is taught in U.S. Pat. No. 5,266,821 to Chern et al., and U.S. Pat. No. 5,032,892 to Chern et al. The capacitors are placed in open space which is not being used for other circuitry. However, as circuit densities increase, there is less and less such open space. There is still a need to increase the circuit density of integrated circuits, especially in dynamic random access memory (DRAM) chips. The storage densities of such chips is growing at a phenomenal rate, and there is a great need to both utilize all the space available for memory cells, and to reduce the size of structures and line widths to provide more memory cells and circuitry in the same space. The need for capacitive decoupling of such circuitry actually increases in importance as the density increases. The same level of power supply voltage spikes and noise exist, and with decreased line widths, have an even more damaging effect.

There is a need for yet further increasing the flexibility and reliability of decoupling capacitors. Yet a further need exists to provide fully isolated capacitor nodes to eliminate the need for bias devices and further conductive paths.

SUMMARY OF THE INVENTION

An on chip multilayer decoupling capacitor structure has a first decoupling capacitor with a first electrode formed in a conductively doped silicon substrate and a second electrode made of conductively doped polysilicon overlaying the first electrode. Third and fourth polysilicon electrodes are formed on top of the first capacitor to form at least one second decoupling capacitor which may be used for a device peripheral to the circuitry decoupled by the first capacitor. Each of the electrodes are electrically isolated from the other electrodes by the use of a dielectric such as TEOS, or oxide and nitride compounds.

The structure provides the ability to use the second decoupling capacitor as a fully isolated capacitor not requiring any biasing. In addition, the first capacitor may be used to provide capacitive decoupling for circuitry associated with a dynamic random access memory (DRAM) device, while the second is being used to provide decoupling for other circuitry, such as transistors. This provides optimal use of space on the chip, allowing space normally used for decoupling capacitors to be used for more memory cells and other circuitry.

In a further embodiment, the third electrode is comprised of two coplanar electrodes separated in the middle by dielectric, while the fourth electrode completely covers the coplanar electrodes. The fourth electrode serves as a common electrode for a pair of series coupled decoupling capacitors. One of the coplanar electrodes is then coupled to a reference voltage, such as ground or a supply voltage, while the other is coupled to a circuit to be decoupled. The series connection reduces the total voltage each capacitor might be subjected to, reducing the risk of breakdown or shorting through deformation in conductors or the dielectrics between electrodes.

In yet a further embodiment, two pair of decoupling capacitors as formed above are coupled in series, providing even greater protection against voltage induced breakdowns of the capacitors. This can easily be done because of the great space savings obtained by stacking the decoupling capacitors on top of active circuitry and because the capacitors are isolated from the active circuitry by a thick layer of dielectric from the first capacitor.

DESCRIPTION OF THE PREFERRED EMBODIMENT

In the following detailed description of the preferred embodiment, reference is made to the accompanying drawing which forms a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present inventions. The following detailed description is, therefore, not to be taken in a limiting sense, and the scope of the present inventions is defined by the appended claims.

Figure 1:
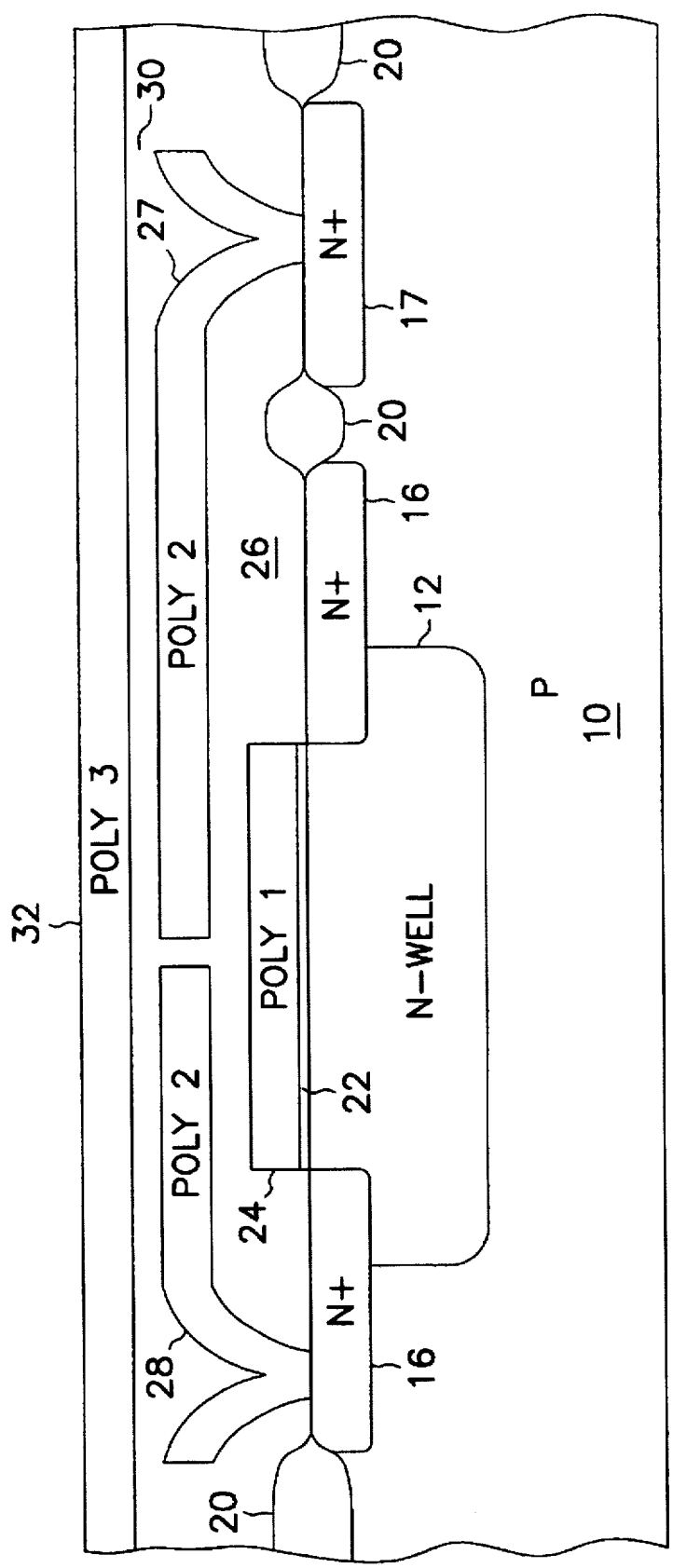
FIG. 1 is a cross sectional representation of a semiconductor die having a decoupling capacitor structure formed on top of other decoupling capacitors in accordance with the present invention.

In FIG. 1, a silicon substrate 10 is part of a semiconductor die on which multiple structures are simultaneously formed, is prepared using conventional process steps wherein the silicon substrate is doped with impurities to form a p-type substrate. An n-well 12 or other form of conductive region is then formed in the substrate 10, and serves as a first electrode. Diffused n+ region 16 is formed on the periphery of n-well 12, and partially overlaps the n-well 12 to provide regions for electrical contact with n-well 12 to metal bus lines which provide reference voltages for supplying power (VCC) and ground (VSS) to integrated circuity formed in substrate 10. At the same time, a diffused n+ region 17 is formed in substrate 10 to provide for electrical contact with an external device, such as a transistor or other circuitry. A thick field oxide layer 20 is grown in areas surrounding locations that define where further conductive layers of multiple decoupling capacitors will be formed. Next, a thin dielectric 22 is formed over at least a portion of the n-well, defining an area where a conductive polysilicon layer 24 is then formed overlaying the same portion of the n-well. Layer 24 forms a second electrode, which together with the first electrode, n-well 12, form a first decoupling thin film capacitor. The first capacitor is used to provide capacitive decoupling for circuitry associated with dynamic random access memory (DRAM) memory cells in one embodiment.

The dielectric material used in the present invention is preferably TEOS, silicon dioxide, silicon nitride, or any combination thereof. Other materials having a suitably high dielectric constant will be apparent to those skilled in the art. The polysilicon used herein is conductively doped, and may be silicided with commonly used silicides including but not limited to titaniumn silicide, or tungsten silicide. In addition, other conductive layers, such as metal, may be used to provide electrical conductive paths without departing from the spirit of the invention.

A further dielectric layer 26 is formed on top of conductive layer 24 and around the edges thereof, followed by the formation of a second polysilicon layer shown at 27 and 28, which is bifurcated into two separate coplanar third and fourth electrodes 27 and 28 by means of standard masking and etching techniques. Prior to 3forming the second polysilicon layer, holes through dielectric layer 26 to diffused n+ regions 16 and 17 are formed using standard masking and etching techniques. When the second polysilicon layers 28 and 27 are formed, they flow into the holes, making electrical contact directly with respective regions 16 and 17. This results in polysilicon layer 28 being coupled to a reference potential such as ground or a supply voltage in one embodiment, and layer 27 being coupled to an external device through n+ region 17. The combination of electrodes 24 and 27 form a second thin film capacitor, and the combination of electrodes 24 and 28 form a third thin film capacitor. If electrodes 27 and 28 are electrically coupled together, then the second and third capacitors become a single, larger capacitor approximately equal to the sum of capacitance of the two capacitors. In any event, such capacitors are very weak due to the relative thickness of dielectric layer 26, and do not normally function well as a capacitor.

Yet a further dielectric layer 30 is formed on top of electrodes 27 and 28, and finally a third polysilicon layer comprising fifth electrode 32 is formed over dielectric layer 30. Fifth electrode 32, together with electrodes 27 and 28 form fourth and fifth capacitors, or a single capacitor if electrodes 27 and 28 are electrically coupled together. The multilayer structure provides the flexibility to provide as many as five separate capacitors, or three larger capacitors. The capacitors are connectable in series or in parallel through the use of well known techniques including the formation of polysilicon conductive paths, metalized layers, vias and contacts for forming connection between vertically spaced structures. The fourth and fifth capacitors may also be used to provide decoupling for the same circuitry, or circuitry different from the circuitry for which the first capacitor provides decoupling.

In one embodiment, the fourth and fifth capacitors formed of polysilicon layers 28, 30 and 27 form a pair of series connected decoupling capacitors, sharing polysilicon layer 30 as a common electrode which is isolated from other circuitry by the dielectric layers. With capacitors designed to operate at voltages near the VCC supply voltage, coupling two capacitors in series across the primary power supplies subjects the capacitors to voltages in the range of VCC/2. This increases their reliability, by reducing the voltage to which they are subjected. There is less chance of shorting through deformations in the conductors or the dielectrics, which are usually fatally irreversible.

By stacking the fourth and fifth capacitors over the capacitors formed by the other electrodes, significant space savings is realized while providing full decoupling of external circuitry.

Figure 2:
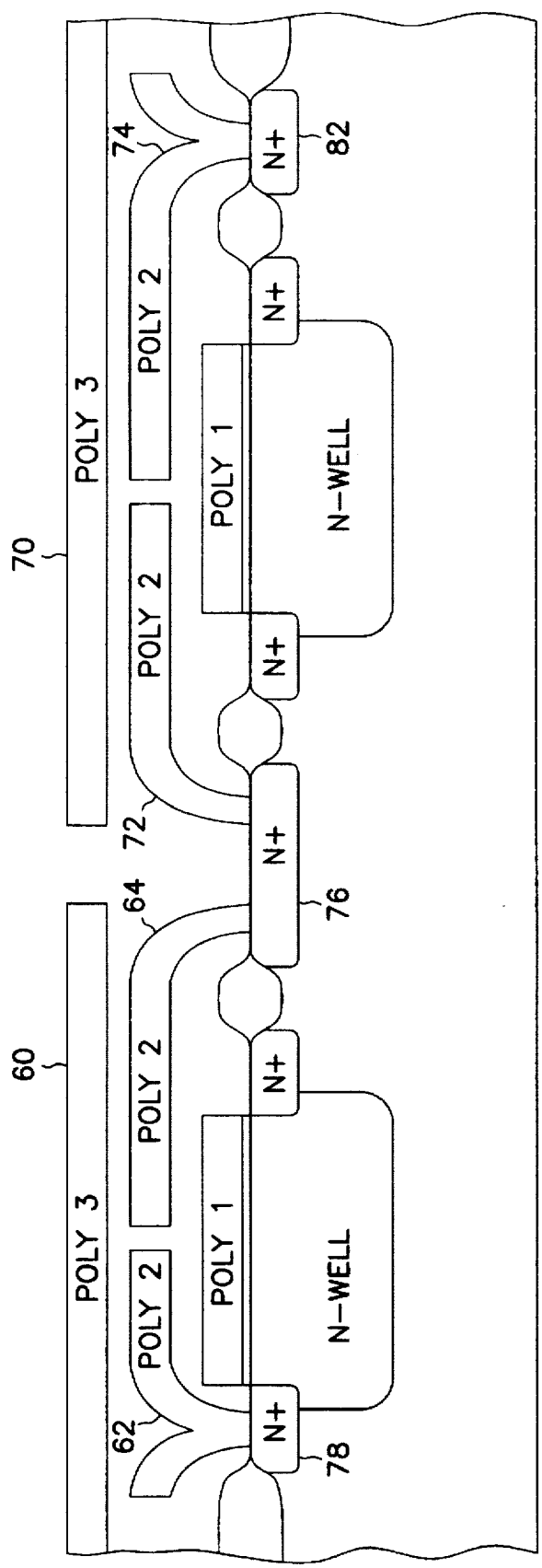
FIG. 2 is a cross sectional representation of a pair of decoupling capacitors of FIG. 1 coupled in series.

A further embodiment of the present invention is shown in FIG. 2. Two sets of fourth and fifth capacitors formed by electrodes 60, 62 and 64 in a first multilayer structure, and 70, 72 and 74 in a second multilayer structure are coupled via a n+ region 76. Electrodes 64 and 72 are coupled to n+ region 76, electrode 62 is coupled to a reference potential such as ground or a supply voltage via a n+ region 78, and electrode 74 is coupled to an external transistor or other circuitry to provide decoupling via n+ region 82. In this manner, four capacitors are coupled in series, resulting in each decoupling capacitor only being subjected to VCC/4 voltage levels. If one capacitor should fail, three remain, and are subjected to VCC/3 levels, still well within acceptable voltage levels. Because the decoupling capacitors are formed over other active circuitry, without adversely affecting the operation of such circuitry, there is an abundance of real estate available on the chip for such doubling up of decoupling capacitors without sacrificing circuit densities.

It should be noted that in CMOS technology, many times certain areas of the semiconductor die described as having a particular doping, could quite easily be of a different doping, promoting a different type of charge carrier. In such instances, if one were to reverse the primary carriers in all areas of the die and adjust for carder mobility, the invention would operate in the same manner as described herein without departing from the scope and spirit of the present invention.

What is claimed is:

1. A multilayer circuit for providing decoupling capacitors for an integrated circuit formed in a semiconductor substrate, comprising:

a first capacitor n well electrode supported by the substrate;

a first and second n+ areas formed on opposite sides of the n well electrode supported by the substrate;

a second capacitor electrode formed of a conductive material at least partially overlaying the first electrode between the first and second n+ areas;

a first dielectric layer formed between the first and second capacitor electrodes;

a third bifurcated capacitor electrode formed of a conductive material, the third capacitor electrode comprising a first portion laterally separated from a second portion, each portion at least partially overlaying the second electrode, and wherein the first portion is coupled to the first n+ area;

a second dielectric layer formed between the second and third capacitor electrodes;

a third n+ area supported by the substrate, and isolated from the first and second n+ areas, said third n+ area being electrically coupled to the second portion of the third bifurcated capacitor electrode;

a fourth capacitor electrode formed of a conductive material at least partially overlaying the third bifurcated capacitor electrode; and a third dielectric layer disposed between the third and fourth electrodes such that pairs of electrodes at least partially overlaying each other may be coupled to operate as decoupling capacitors.

* * * * *